United States Patent

Minami

[11] 4,144,484
[45] Mar. 13, 1979

[54] DC VOLTAGE CONTROL DEVICE

[75] Inventor: Shunji Minami, Katano, Japan

[73] Assignee: Matsushita Electric Industrial Co., Ltd., Osaka, Japan

[21] Appl. No.: 864,452

[22] Filed: Dec. 27, 1977

[30] Foreign Application Priority Data

Jan. 17, 1977 [JP] Japan .................. 52-4307

[51] Int. Cl.² .............................................. G05F 3/08
[52] U.S. Cl. .................................... 323/19; 323/22 R
[58] Field of Search .................. 307/251, 304; 323/19, 323/22 R

[56] References Cited

U.S. PATENT DOCUMENTS

| | | | |
|---|---|---|---|
| 3,919,668 | 11/1975 | Minami et al. | 323/22 R |
| 3,925,720 | 12/1975 | Minami et al. | 323/22 R |
| 3,988,596 | 10/1976 | Minami et al. | 307/304 X |
| 4,032,838 | 6/1977 | Minami et al. | 323/22 R |

*Primary Examiner*—A. D. Pellinen
*Attorney, Agent, or Firm*—Burgess, Ryan and Wayne

[57] ABSTRACT

A DC voltage control device comprising first and second R-S flip-flops, two diodes and an analog memory comprising a MOS field-effect transistor, a nonpolarized capacitor and an analog switch. The DC voltage may be increased, decreased and maintained at a desired level. Because of the analog memory, the signal level is stored or maintained even in case of power failure. The DC voltage control device may be used as a brightness control of an incandescent lamp, VCF (voltage controlled frequency) of a sweep generator and so on.

5 Claims, 7 Drawing Figures

DC VOLTAGE CONTROL DEVICE

BACKGROUND OF THE INVENTION

The present invention relates to a DC voltage control device for increasing or decreasing a DC voltage to a desired level and storing or maintaining it at the desired level.

There are various types of analog memory. A first type consists of the combination of a motor and a potentiometer; a second type utilizes a capacitor; a third type is of a digital memory system consisting of an A/D converter, a digital memory and a D/A converter; a fourth type utilizes magnetism; a fifth type utilizes electrochemical phenomena. However with the analog memory of the type consisting of a motor and a potentiometer for increasing or decreasing a DC voltage to a desired level and maintaining it at the desired level, the response of the output to the input is not accurate because of dimensional variations due to manufacturing tolerances of mechanical parts. Furthermore, the digital memory type analog memory requires the analog-to-digital and digital-to-analog conversions so that it is complex in construction and large in size.

SUMMARY OF THE PRESENT INVENTION

In view of the above, the present invention has for its object to provide a DC voltage control device which is very simple in construction yet very reliable and stable in operation of increasing or decreasing a DC voltage to a desired level and storing or maintaining it at the desired level.

To the above and other ends, briefly stated, the present invention provides a DC voltage control device comprising an analog memory, a first R-S flip-flop, a second R-S flip-flop, a first diode, a second diode and up, down and stop switches. By the operations of these up, down and stop switches the output from the analog memory may be controlled at a desired level.

DESCRIPTION OF THE PREFERRED EMBODIMENTS

Figure 1:
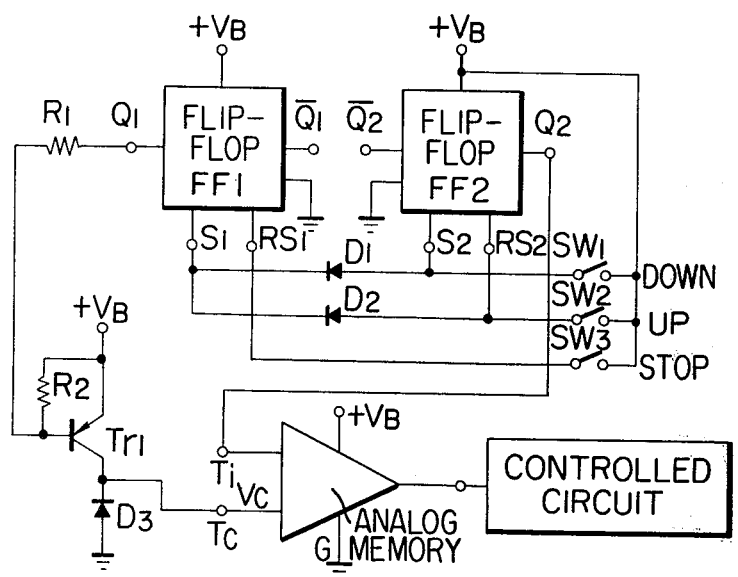
FIG. 1 is a circuit diagram of a first embodiment of the present invention.
Figure 2:
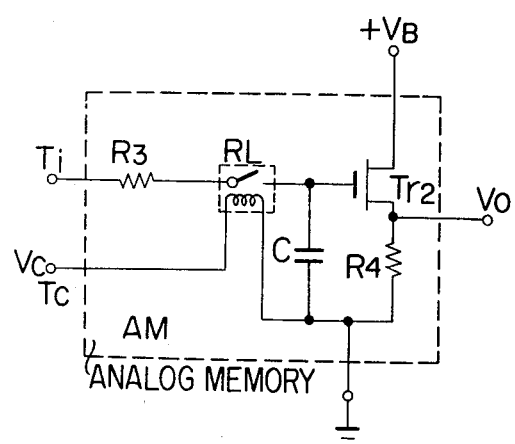
FIG. 2 is a circuit diagram of an analog memory thereof.
Figure 3:
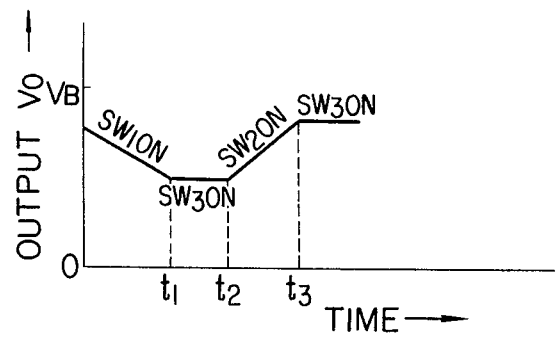
FIG. 3 shows the variations in output from the analog memory.

First Embodiment, FIGS. 1-3

Referring to FIG. 1, the set input $S_1$ of a first R-S flip-flop FF1 and the set input $S_2$ of a second R-S flip-flop FF2 are interconnected through a first diode $D_1$ to each other while the set input $S_1$ of the first flip-flop FF1 and the reset input $RS_2$ of the second flip-flop FF2 are interconnected through a second diode $D_2$ to each other. The output $Q_1$ of the first flip-flop FF1 is connected through a resistor $R_1$ to the base of a transistor $Tr_1$ which in turn is connected through a resistor $R_2$ to the emitter and a power source $+V_B$.

The collector of the transistor $Tr_1$ is grounded through a third diode $D_3$ and is connected to the control terminal Tc of an analog memory AM. The output $Q_2$ of the second flip-flop FF2 is connected to the input terminal Ti of the analog memory AM the output of which is connected to a controlled circuit such as an incandescent lamp. One ends (anodes) of the first and second diodes $D_1$ and $D_2$ and the reset input terminal $RS_1$ of the first flip-flop FF1 are connected to one ends of switches $SW_1$, $SW_2$ and $SW_3$, respectively, the other ends of which are connected to a power source $+V_B$. The first and second flip-flops FF1 and FF2 are connected to the power sources $+V_B$ and grounded as shown, and their output terminals $Q_1$ and $Q_2$ are used.

In FIG. 2 there is shown a circuit diagram of the analog memory AM. The input terminal Ti is connected through a resistor $R_3$ to one end of a reed relay RL the other end of which is connected to the gate of a MOS field-effect transistor $Tr_2$. A nonpolarized capacitor C is interconnected between the gate and the earth, and the source of the transistor $Tr_2$ is grounded through an output resistor $R_4$. One end of the coil of the reed relay RL is connected to the control terminal Tc while the other end is grounded. The drain of the transistor $Tr_2$ is connected to the power source $+V_B$, and the source follower output Vo is derived from the source of the transistor $Tr_2$ and is applied to the controlled circuit as the output of the analog memory AM.

Next referring to FIGS. 1, 2 and 3 the mode of operation of the first embodiment with the above construction will be described. When the switch $SW_1$ is closed, the signal is impressed through the first diode $D_1$ to the set input terminal $S_1$ of the first flip-flop FF1 and to the set input terminal $S_2$ of the second flip-flop FF2. The output terminals $Q_1$ and $Q_2$ of the flip-flops FF1 and FF2 change to low level so that the current flows through the resistor $R_1$ and the transistor $Tr_1$ is turned on. Then the control signal Vc is applied to the control terminal Tc of the analog memory AM so that the coil of the reed relay RL is energized and the relay is closed. Since the output $Q_2$ of the second flip-flop FF2 is at low level, the voltage charged across the capacitor C is discharged so that the current flow through the field-effect transistor $Tr_2$ is decreased and the output Vo gradually drops (to 0 V) as shown in FIG. 3. When the switch $SW_1$ is opened while the switch $SW_3$ is closed at $t_1$ when the output Vo is dropping, the output $Q_1$ of the first flip-flop FF1 changes to high level so that the transistor $Tr_1$ is turned off. The coil of the reed relay is de-energized so that the relay is turned off. The discharge of the capacitor C is suspended so that the output Vo remains at a constant level. That is, the field-effect transistor $Tr_2$ stores the output voltage Vo of a certain magnitude. The output voltage Vo supplied to the controlled circuit F from the analog memory AM is maintained at a constant level after the time $t_1$.

When the switch $SW_3$ is turned off while the switch $SW_2$ is closed at a time $t_2$, the output $Q_1$ of the first flip-flop FF1 changes to low level so that the transistor $Tr_1$ is turned on. As a result the reed relay RL is closed. The output $Q_2$ of the second flip-flop FF2 is at high level so that the capacitor C is charged. Consequently the current flow through the field-effect transistor $Tr_2$ is increased so that the source follower output Vo rises toward approximately $+V_B$. When the switch $SW_3$ is closed at $t_3$ when the output Vo is rising, the output $Q_1$ of the first flip-flop FF1 changes to high level so that both the transistor $Tr_1$ and the read relay RL are turned off. Therefore, the analog memory AM stores the source follower output Vo of the transistor $Tr_2$ when the read relay was turned off.

As described above with the operations of the switches $SW_1$, $SW_2$ and $SW_3$, the DC voltage output Vo may be reduced, increased and stored or maintained at a constant level. Therefore, when the controlled circuit F consists of an incandescent lamp, the intensity of light may be suitably controlled and maintained at a desired level.

Figure 4:
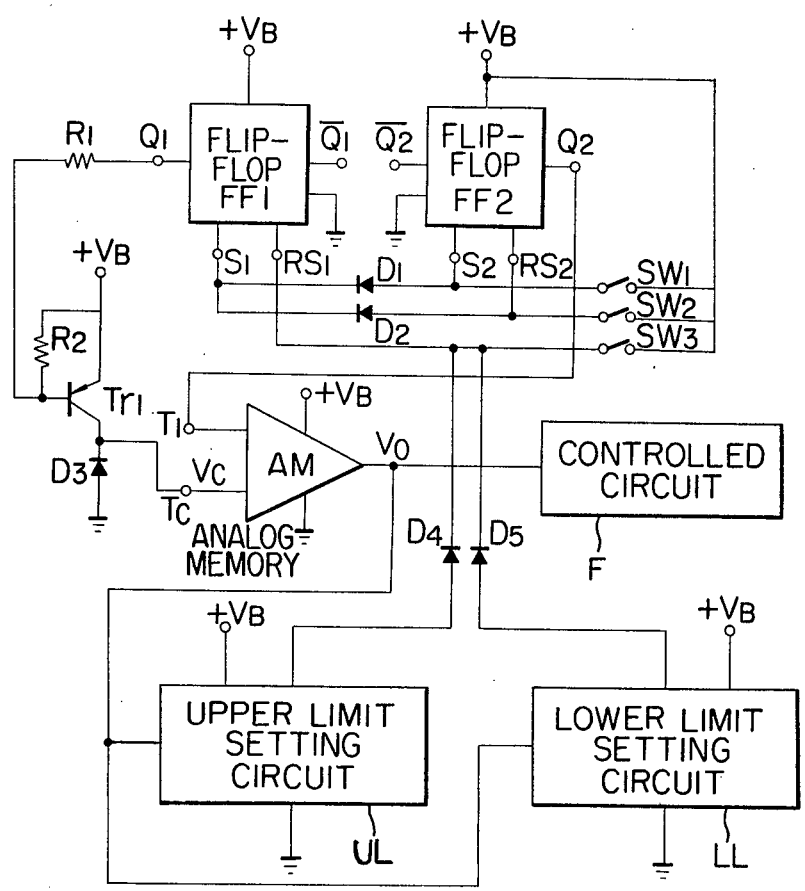
FIG. 4 is a circuit diagram of a second embodiment of the present invention.
Figure 5:
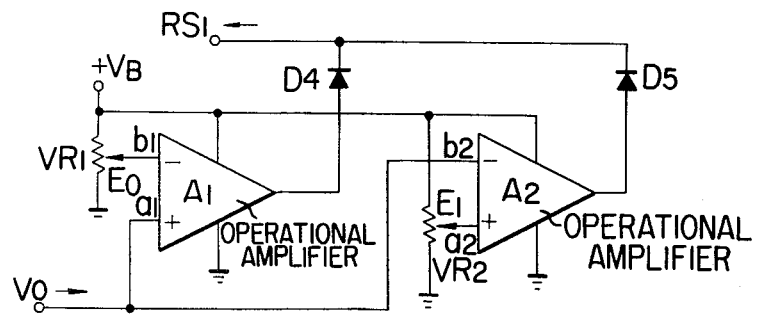
FIG. 5 is a circuit diagram of upper and lower limit setting circuits thereof.
Figure 6:
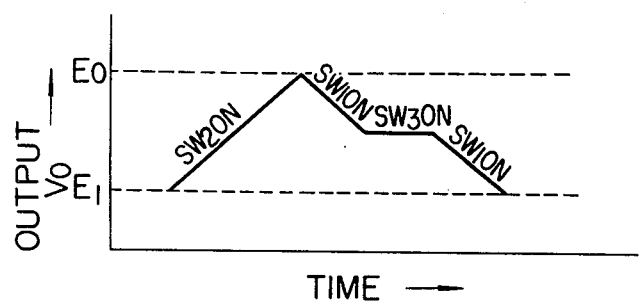
FIG. 6 shows the variation in output from an analog memory of the second embodiment.

Second Embodiment, FIGS. 4–6

The second embodiment shown in FIG. 4 is substantially similar in construction to the first embodiment except that the second embodiment includes upper and lower limit setting circuits UL and LL. The input terminals of the upper and lower limit setting circuits UL and LL are connected to the output terminal of the analog memory AM while the output terminals are connected through fourth and fifth diodes $D_4$ and $D_5$, respectively, to the reset input terminal $RS_1$ of the first flip-flop FF1.

In FIG. 5 there is shown a circuit diagram of the upper and lower limit setting circuits UL and LL each consisting of an operational amplifier $A_1$ or $A_2$. The output of the analog memory AM is connected to the noninverting input terminal $a_1$ of the first operational amplifier $A_1$ and to the inverting input terminal $b_2$ of the second operational amplifier $A_2$. The movable sliders or contacts of variable resistors $VR_1$ and $VR_2$ are connected to the inverting input terminal $b_1$ of the first amplifier $A_1$ and to the noninverting input terminal $a_2$ of the second operational amplifier $A_2$. The first and second operational amplifiers $A_1$ and $A_2$ and the variable resistors $VR_1$ and $VR_2$ are connected to the power source $+V_B$ and grounded as shown.

Next the mode of operation of the second embodiment will be described. The variable resistors $VR_1$ and $VR_2$ are set to $E_0$ ($V_B > E_0$) and $E_1$ ($E_0 > E_1$). When the output Vo of the analog memory AM rises in response to the closing of the switch $SW_2$ and exceeds $E_0$, the positive output is derived from the first operational amplifier $A_1$ so that the output $Q_1$ of the first flip-flop FF1 changes to high level. As a result, the transistor $Tr_1$ and the reed relay RL are turned off so that the output voltage rise stops at the preset level $E_0$. When the output Vo of the analog memory AM drops below the preset level $E_1$, the positive output is derived from the second operational amplifier $A_2$ so that the output $Q_1$ of the first flip-flop FF1 changes to high level. As a result the transistor $Tr_1$ and the reed relay RL are turned off so that the output voltage drop stops at the preset level $E_1$. That is, the mode of operation of the second embodiment is substantially similar to that of the first embodiment except that the voltage rise and drop stop at predetermined upper and lower limits $E_0$ and $E_1$ as shown in FIG. 6.

Figure 7:
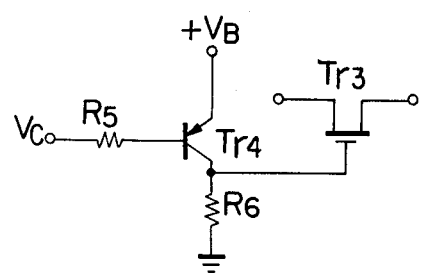
FIG. 7 is a circuit diagram of an analog switch for use in the analog memory.

Instead of the reed relay RL of the analog memory AM, an analog switch consisting of a MOS field-effect transistor $Tr_3$ as shown in FIG. 7 may be also used. The gate of the transistor $Tr_3$ is connected to a gate circuit consisting of a transistor $Tr_4$ and resistors $R_5$ and $R_6$.

As described above, according to the present invention the level of the DC voltage may be varied arbitrarily by the very simple operations. When the device in accordance with the present invention is incorporated in a DC phase control system, the intensity of light emitted from an incandescent lamp may be arbitrarily increased, decreased and stored or maintained at a desired level with the operations of the three switches. Furthermore, the device may be used in conjunction with VCF (voltage controlled frequency) such as a sweep generator so that the frequency may be increased, decreased or maintained at a desired level by the operations of the three switches. Thus the DC voltage control device in accordance with the present invention may be controlled in a simple manner by three switches.

What is claimed is:

1. A DC voltage control device comprising
  (a) an analog memory comprising
    a MOS field-effect transistor, and
    a nonpolarized capacitor
  (b) a first R-S flip-flop connected to a first input terminal of said analog memory,
  (c) a second R-S flip-flop connected to a second input terminal of said analog memory,
  (d) a first diode connected between a second set input terminal of said second R-S flip-flop and a first set input terminal of said first R-S flip-flop,
  (e) a second diode connected between a second rest input terminal of said second R-S flip-flop and a first set input terminal of said first R-S flip-flop,
  (f) a down switch connected to said second set input terminal of said second R-S flip-flop,
  (g) an up switch connected to said second reset input terminal of said second R-S flip-flop, and
  (h) a stop switch connected to said first reset input terminal of said first R-S flip-flop,
whereby the output of said analog memory may be controlled by the operations of said down, up and stop switches.

2. A DC voltage control device as set forth in claim 1 wherein an analog switch in said analog memory consists of a reed relay.

3. A DC voltage control device as set forth in claim 1 wherein an analog switch in said analog memory consists of a semiconductor switch.

4. A DC voltage control device as set forth in claim 1 wherein the output terminal of said analog memory is connected to the input terminals of an upper limit setting circuit and a lower limit setting circuit, and the output terminals of said upper and lower limit setting circuits are connected to said first reset input terminal of said first R-S flip-flop.

5. A DC voltage control device as set forth in claim 4 wherein said upper and lower limit setting circuits consist of operational amplifiers.

* * * * *